United States Patent
Stojetz et al.

(10) Patent No.: US 11,165,223 B2
(45) Date of Patent: Nov. 2, 2021

(54) SEMICONDUCTOR LIGHT SOURCE

(71) Applicant: OSRAM OLED GMBH, Regensburg (DE)

(72) Inventors: Bernhard Stojetz, Wiesent (DE);
Alfred Lell, Maxhütte-Haidhof (DE);
Christoph Eichler, Donaustauf (DE);
Andreas Loeffler, Neutraubling (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/890,776

(22) Filed: Jun. 2, 2020

(65) Prior Publication Data
US 2020/0303898 A1    Sep. 24, 2020

Related U.S. Application Data

(62) Division of application No. 16/075,853, filed as application No. PCT/EP2017/055823 on Mar. 13, 2017, now Pat. No. 10,075,853.

(30) Foreign Application Priority Data

Mar. 14, 2016    (DE) .......... 10201610461617

(51) Int. Cl.
*H01S 5/06*    (2006.01)
*H01L 33/50*    (2010.01)
(Continued)

(52) U.S. Cl.
CPC .............. *H01S 5/0609* (2013.01); *F21K 9/64* (2016.08); *H01L 33/502* (2013.01);
(Continued)

(58) Field of Classification Search
CPC ....... F21K 9/64; H01L 33/505; H01L 33/508; H01L 33/507; H01L 33/50–508;
(Continued)

(56) References Cited

U.S. PATENT DOCUMENTS 5,247,168 A * 9/1993 Pocholle ............. G02F 2/02
250/214 LS
5,285,465 A * 2/1994 Schilling ............. G02F 3/00
372/50.1
(Continued)

FOREIGN PATENT DOCUMENTS

CN    2593371 Y    12/2003
CN    102263172 A    11/2011
(Continued)

OTHER PUBLICATIONS

Kölper, C. et al., "Optical Properties of Individual GaN Nanorods for Light Emitting Diodes: Influence of Geometry, Materials and Facets," Procl of SPIE, Physics and Simulation of Optoelectronic Devices XIX, vol. 7933, S.793314-1-S.793314-9, 2011, 9 pages.
(Continued)

*Primary Examiner* — Joshua King
(74) *Attorney, Agent, or Firm* — Slater Matsil, LLP

(57) ABSTRACT

A semiconductor light source is disclosed. In one embodiment, a semiconductor light source includes at least one semiconductor laser configured to generate a primary radiation and at least one conversion element configured to generate a longer-wave visible secondary radiation from the primary radiation, wherein the conversion element includes a semiconductor layer sequence having one or more quantum well layers, wherein, in operation, the primary radiation is irradiated into the semiconductor layer sequence parallel to a growth direction thereof, with a tolerance of at most 15°, wherein, in operation, the semiconductor layer sequence is homogeneously illuminated with the primary radiation, and wherein a growth substrate of the semiconductor layer sequence is located between the semiconductor layer sequence and the semiconductor laser, the growth substrate being oriented perpendicular to the growth direction.

17 Claims, 9 Drawing Sheets

(51) Int. Cl.
　　　*H01S 5/00*　　　　　(2006.01)
　　　*F21K 9/64*　　　　　(2016.01)
　　　*H01S 5/22*　　　　　(2006.01)
　　　*H01S 5/30*　　　　　(2006.01)
　　　*H01S 5/34*　　　　　(2006.01)
　　　*H01L 33/18*　　　　 (2010.01)
　　　*F21Y 115/30*　　　　(2016.01)

(52) U.S. Cl.
　　　CPC .......... *H01S 5/0087* (2021.01); *H01S 5/2228* (2013.01); *H01S 5/309* (2013.01); *H01S 5/3408* (2013.01); *F21Y 2115/30* (2016.08); *H01L 33/18* (2013.01); *H01L 33/507* (2013.01)

(58) Field of Classification Search
　　　CPC ...... H01S 5/005; H01S 5/0071; H01S 5/0092; H01S 5/18; H01S 5/0087; F21Y 2115/30
　　　See application file for complete search history.

(56) References Cited

U.S. PATENT DOCUMENTS

| | | | | |
|---|---|---|---|---|
| 6,252,254 B1* | 6/2001 | Soules | ................. | H01L 33/504 257/89 |
| 6,535,537 B1* | 3/2003 | Kinoshita | ............... | H01S 5/041 372/50.11 |
| 6,714,574 B2* | 3/2004 | Clayton | ................. | H01S 5/041 372/50.1 |
| 6,858,081 B2* | 2/2005 | Biwa | ...................... | C30B 25/02 117/102 |
| 7,087,932 B2* | 8/2006 | Okuyama | ......... | H01L 21/02609 257/89 |
| 7,394,841 B1* | 7/2008 | Konttinen | .......... | G03B 21/2013 372/45.013 |
| 8,237,151 B2* | 8/2012 | Lochtefeld | ........ | H01L 21/02639 257/13 |
| 8,399,876 B2 | 3/2013 | Kim | | |
| 8,455,903 B2 | 6/2013 | Leatherdale et al. | | |
| 8,488,641 B2 | 7/2013 | Haase et al. | | |
| 8,519,378 B2* | 8/2013 | Hiruma | .................. | H01L 33/06 257/13 |
| 8,686,449 B2* | 4/2014 | Li | ............................ | F21V 3/12 257/89 |
| 8,724,054 B2* | 5/2014 | Jones | ...................... | H01L 33/50 349/70 |
| 8,895,337 B1* | 11/2014 | Wang | ..................... | H01L 33/04 438/47 |
| 9,024,294 B2* | 5/2015 | Seong | ................... | H01L 27/156 257/13 |
| 9,087,971 B2* | 7/2015 | Lee | ......................... | H01L 33/46 |
| 9,190,563 B2* | 11/2015 | Hwang | .................. | H01L 33/08 |
| 9,287,446 B2* | 3/2016 | Yoo | ........................ | H01L 33/18 |
| 9,293,622 B2 | 3/2016 | Smith et al. | | |
| 9,450,018 B2* | 9/2016 | Kim | ........................ | H01L 33/24 |
| 9,461,199 B2* | 10/2016 | Heo | ........................ | H01L 33/06 |
| 9,502,605 B2* | 11/2016 | Han | ........................ | H01L 33/06 |
| 9,508,893 B2* | 11/2016 | Cha | ...................... | H01L 33/005 |
| 9,508,898 B2* | 11/2016 | Chung | ................... | H01L 33/32 |
| 9,515,224 B2* | 12/2016 | Hwang | ................. | H01L 33/007 |
| 9,525,100 B2* | 12/2016 | Yoo | ....................... | H01L 33/387 |
| 9,531,161 B2 | 12/2016 | Ristic et al. | | |
| 9,537,049 B2* | 1/2017 | Hwang | .................. | H01L 33/24 |
| 9,966,503 B2 | 5/2018 | Straßburg et al. | | |
| 9,966,726 B2* | 5/2018 | Xing | ..................... | H01S 3/1645 |
| 10,100,997 B2* | 10/2018 | Albou | ................... | B60Q 1/2607 |
| 10,290,767 B2* | 5/2019 | Mi | ........................ | H01L 33/32 |
| 10,343,622 B2* | 7/2019 | Dellock | ................. | F21S 43/14 |
| 2001/0050371 A1* | 12/2001 | Odaki | ................... | C09K 11/7731 257/98 |
| 2002/0003233 A1* | 1/2002 | Mueller-Mach | ...... | H01L 33/504 257/84 |
| 2002/0145685 A1* | 10/2002 | Mueller-Mach | ........................... | G02F 1/133617 349/61 |
| 2003/0063748 A1* | 4/2003 | Shields | ................... | B82Y 30/00 380/256 |
| 2004/0263074 A1* | 12/2004 | Baroky | ............... | H01S 5/02257 313/512 |
| 2005/0006636 A1 | 1/2005 | Shim et al. | | |
| 2005/0152429 A1* | 7/2005 | Scherer | ................... | B82Y 10/00 372/92 |
| 2006/0002443 A1* | 1/2006 | Farber | ..................... | H01S 5/141 372/50.1 |
| 2006/0097389 A1* | 5/2006 | Islam | ..................... | B82Y 10/00 257/734 |
| 2006/0098705 A1* | 5/2006 | Wang | ..................... | B82Y 20/00 372/50.124 |
| 2007/0172183 A1* | 7/2007 | Wang | ..................... | B82Y 20/00 385/125 |
| 2007/0178615 A1* | 8/2007 | Banin | .................... | B82Y 20/00 438/29 |
| 2008/0121911 A1* | 5/2008 | Andrews | ................ | H01L 33/58 257/98 |
| 2010/0276664 A1* | 11/2010 | Hersee | ................... | B82Y 20/00 257/15 |
| 2010/0283072 A1* | 11/2010 | Kazlas | ................... | G02B 6/005 257/98 |
| 2011/0025951 A1* | 2/2011 | Jones | ...................... | H01L 33/50 349/70 |
| 2011/0036396 A1* | 2/2011 | Jayaraman | ........... | H01L 29/0676 136/255 |
| 2011/0052114 A1* | 3/2011 | Bernasconi | ............. | H01S 5/50 385/3 |
| 2011/0081109 A1* | 4/2011 | Thylen | .................. | H01S 5/1067 385/30 |
| 2011/0140072 A1* | 6/2011 | Varangis | ................ | B82Y 20/00 257/9 |
| 2011/0150019 A1* | 6/2011 | Leatherdale | ............ | H01S 5/041 372/45.01 |
| 2011/0169025 A1* | 7/2011 | Kishino | ............... | H01L 29/0669 257/89 |
| 2011/0180824 A1* | 7/2011 | Tan | ........................... | F21K 9/65 257/89 |
| 2011/0291069 A1* | 12/2011 | Kim | ....................... | H01L 33/08 257/13 |
| 2011/0291072 A1* | 12/2011 | Kim | ....................... | H01L 33/08 257/13 |
| 2012/0068153 A1* | 3/2012 | Seong | ..................... | H01L 33/24 257/13 |
| 2012/0097983 A1 | 4/2012 | Smith et al. | | |
| 2012/0235117 A1* | 9/2012 | Fukui | ................. | H01L 21/02381 257/13 |
| 2013/0221323 A1* | 8/2013 | Kuo | ........................ | H01L 33/20 257/13 |
| 2013/0280908 A1* | 10/2013 | Li | ...................... | H01L 21/30612 438/674 |
| 2014/0126200 A1* | 5/2014 | Kelchner | ................ | F21K 9/90 362/231 |
| 2014/0219306 A1* | 8/2014 | Wright | ..................... | H01S 5/11 372/45.012 |
| 2014/0264260 A1* | 9/2014 | Chang | .................. | H01L 33/005 257/13 |
| 2014/0286367 A1* | 9/2014 | Scofield | ................. | H01S 5/341 372/43.01 |
| 2014/0286369 A1* | 9/2014 | Katz | ...................... | H01L 33/42 372/45.012 |
| 2014/0353712 A1* | 12/2014 | Chang-Hasnain | ....... | H01L 33/26 257/103 |
| 2015/0267881 A1* | 9/2015 | Salter | .................... | F21V 9/38 362/84 |
| 2015/0372195 A1* | 12/2015 | Hwang | .................. | H01L 33/24 257/13 |
| 2016/0116123 A1* | 4/2016 | Yamanaka | ............ | H01S 5/0087 362/84 |

(56) References Cited

U.S. PATENT DOCUMENTS

| | | | | |
|---|---|---|---|---|
| 2016/0181485 A1* | 6/2016 | Lee | ...................... | H01L 33/505 257/98 |
| 2018/0198046 A1* | 7/2018 | Hwang | ................... | H01L 33/60 |
| 2019/0170314 A1* | 6/2019 | Lenef | ...................... | F21S 43/26 |

FOREIGN PATENT DOCUMENTS

| | | | | |
|---|---|---|---|---|
| CN | 102804422 A | | 11/2012 | |
| DE | 102008020321 A1 * | | 10/2009 | ............. H01L 33/18 |
| DE | 102010012711 A | | 9/2011 | |
| DE | 102013104273 A1 | | 10/2014 | |
| DE | 102013114466 A1 | | 6/2015 | |
| DE | 102016014938 A1 * | | 6/2018 | ......... H01S 5/04253 |
| DE | 102016014938 A1 | | 6/2018 | |
| JP | 2007281477 A * | | 10/2007 | ........... G02B 6/1225 |
| JP | 2007281477 A | | 10/2007 | |
| WO | WO-2010027648 A1 * | | 3/2010 | ............. H01S 5/041 |

OTHER PUBLICATIONS

Zhang, S. et al., "On the Efficiency Droop of Top-Down Etched InGaN/GaN Nanorod Light Emitting Diodes under Optical Pumping," AIP Advances 3, 2013, 9 pages.

\* cited by examiner

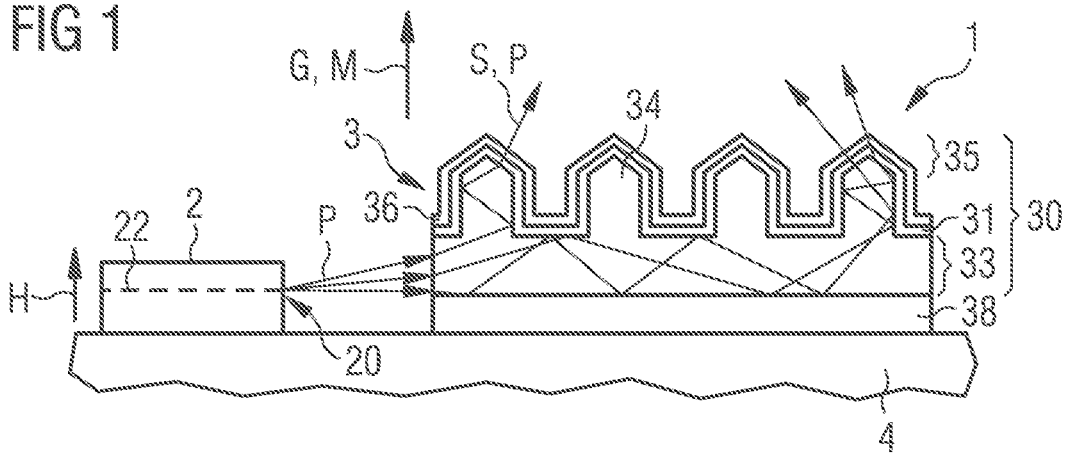
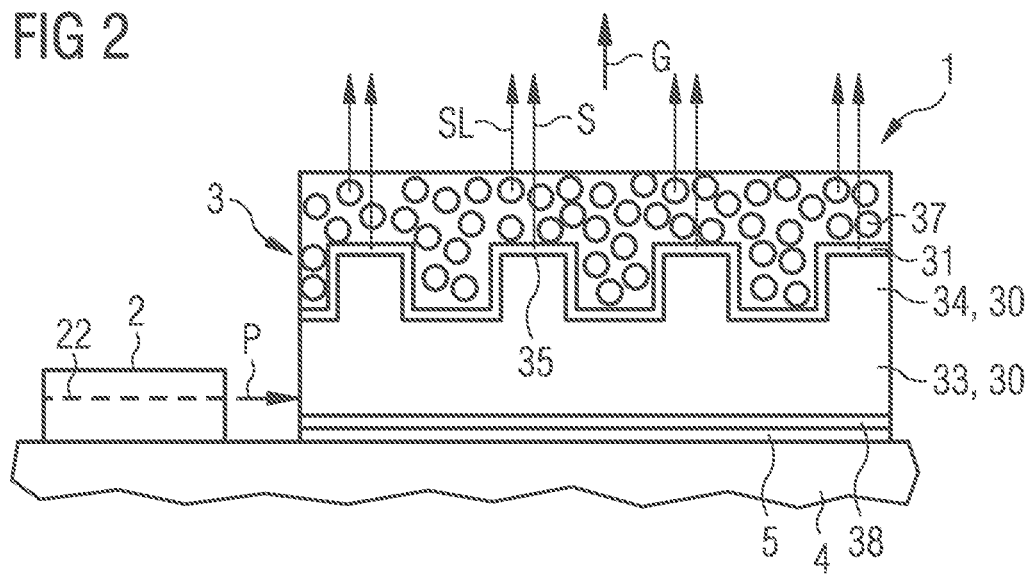
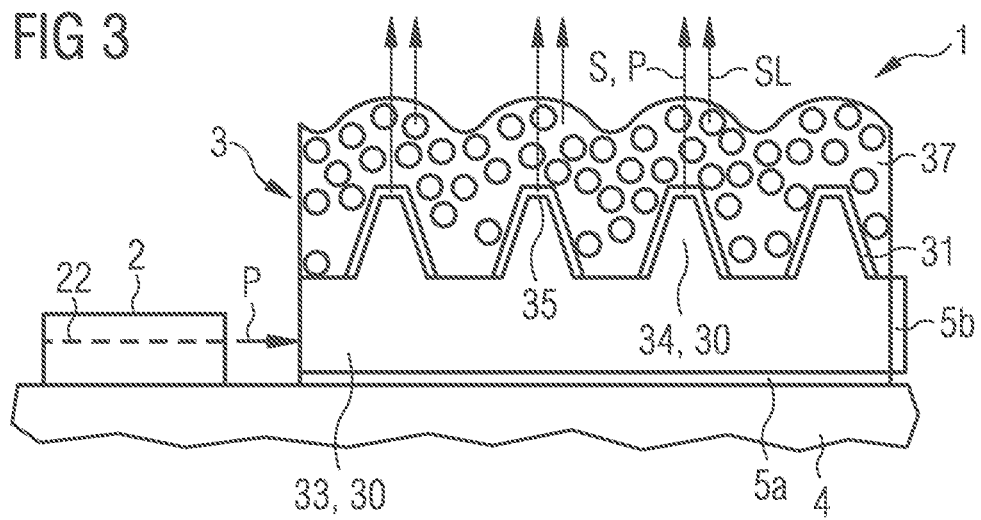

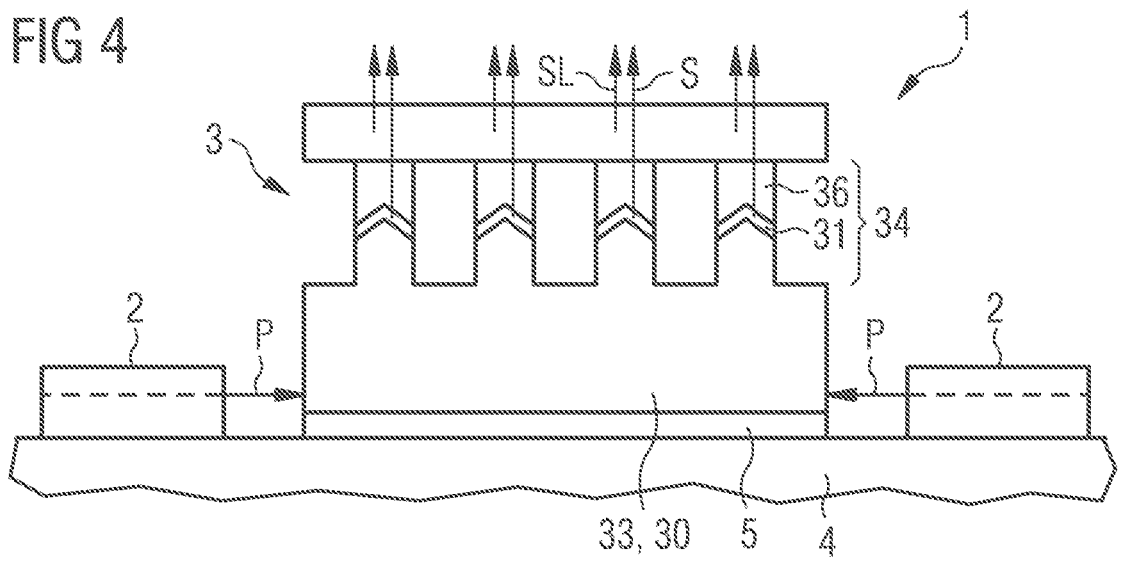
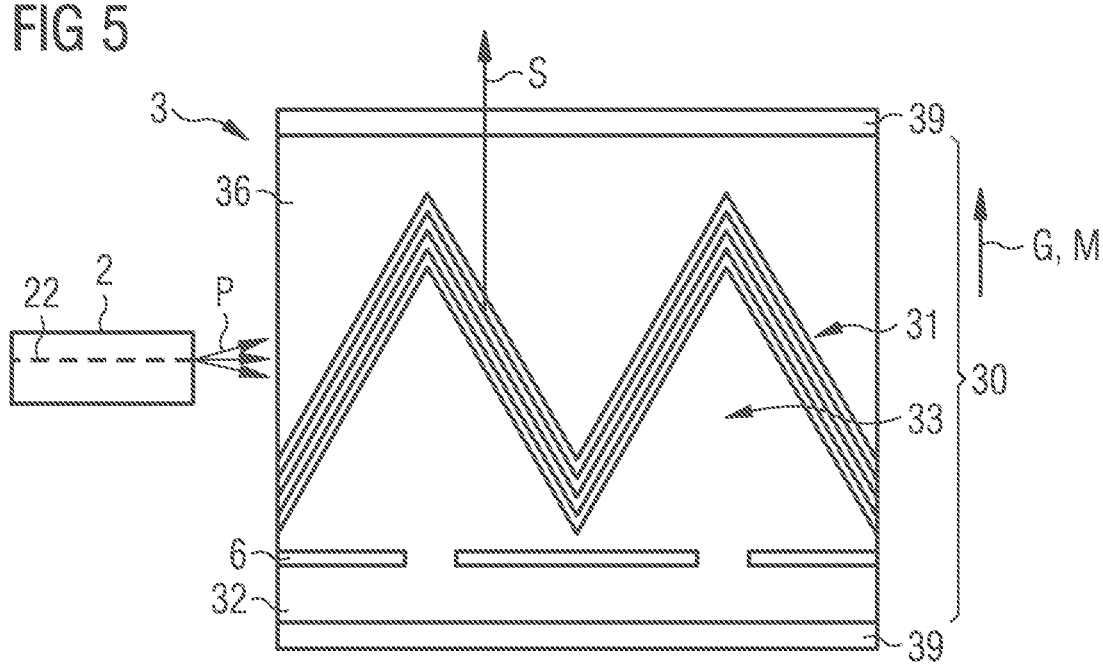

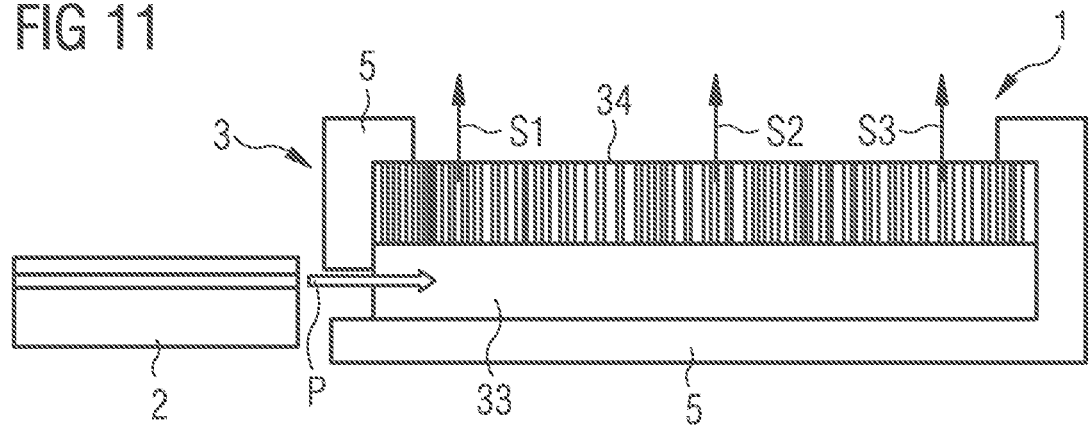
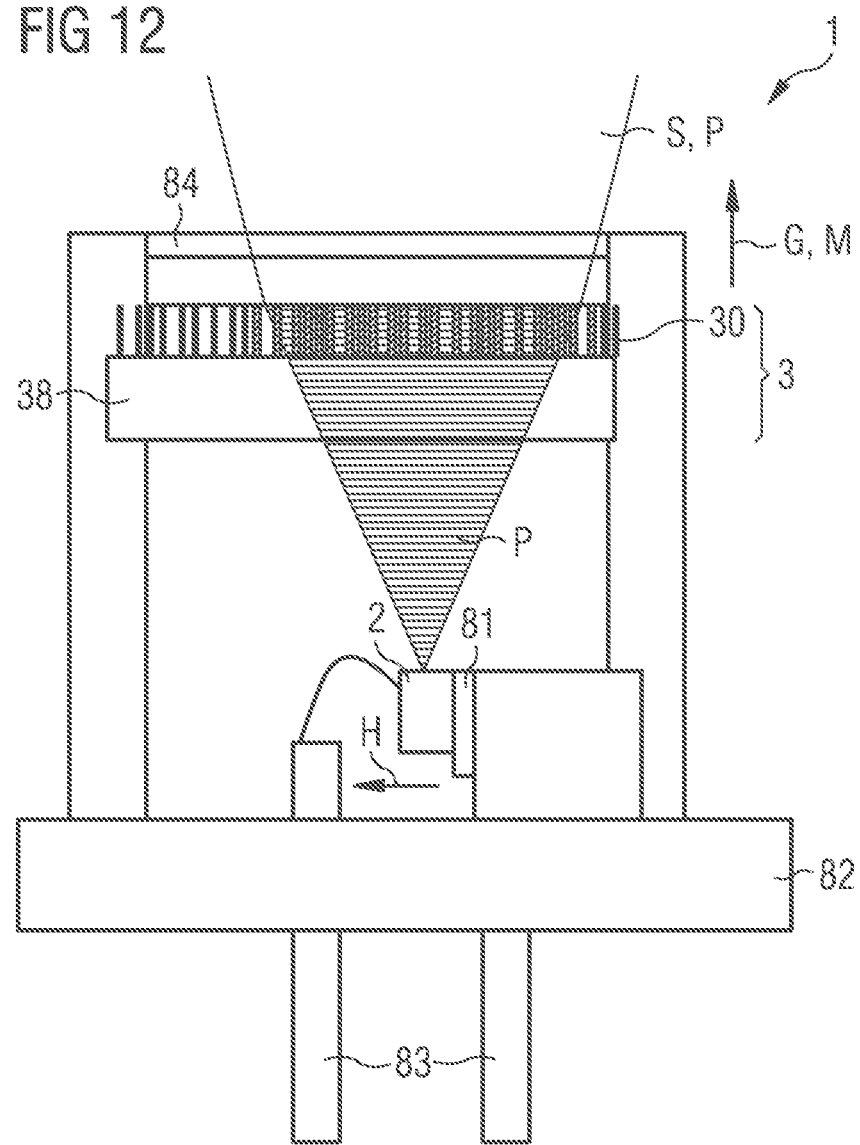

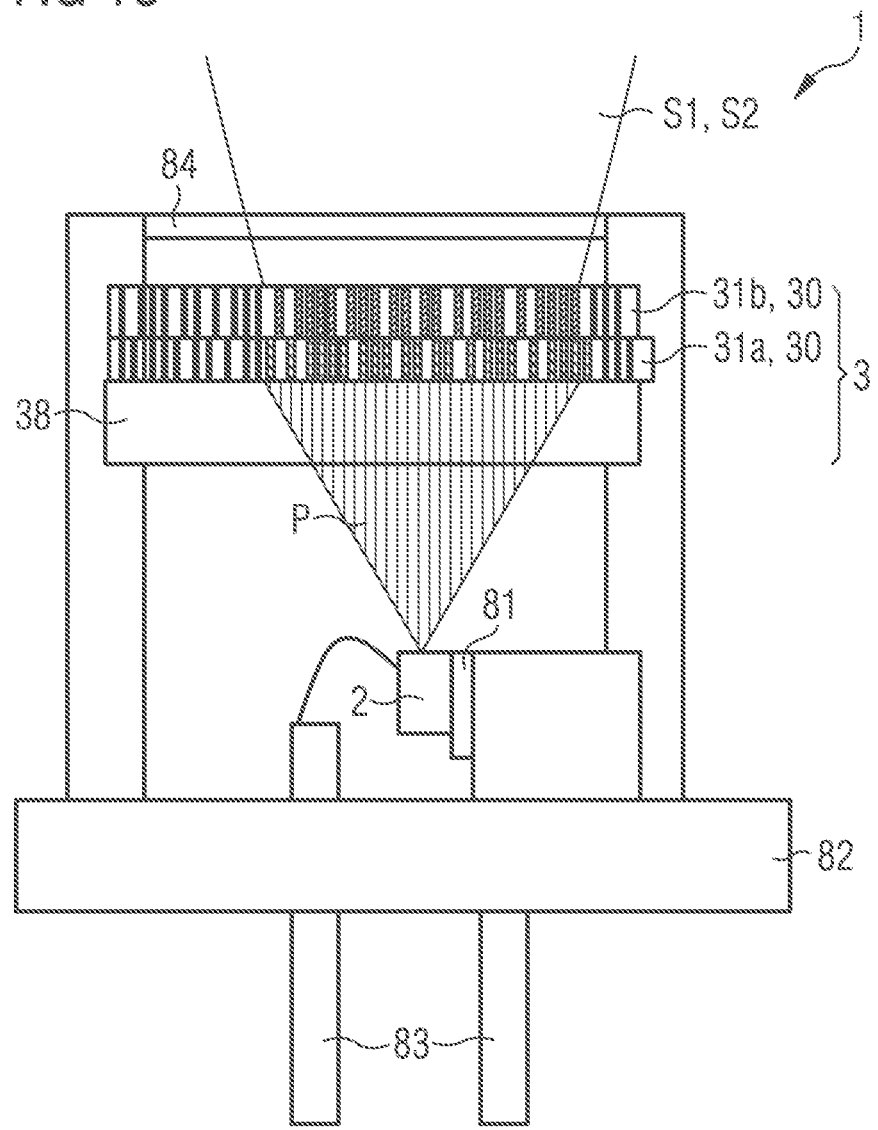

SEMICONDUCTOR LIGHT SOURCE

CROSS-REFERENCE TO RELATED APPLICATIONS

This is a divisional application of U.S. application Ser. No. 16/075,853, entitled "Semiconductor Light Source," which was filed on Aug. 6, 2018, which is a national phase filing under section 371 of PCT/EP2017/055823, filed Mar. 13, 2017, which claims the priority of German patent application 10 2016 104 616.7, filed Mar. 14, 2016, all of which are incorporated herein by reference in its entirety.

TECHNICAL FIELD

A semiconductor light source is specified.

SUMMARY OF THE INVENTION

Embodiments provide a semiconductor light source which emits radiation that can be directed efficiently into a specific spatial region and can be adjusted in different colors.

According to at least one embodiment, the semiconductor light source comprises one or more semiconductor lasers for generating a primary radiation. In this case, it is possible to use a plurality of structurally identical semiconductor lasers or also a plurality of different semiconductor lasers, in particular, having different emission spectra. The semiconductor light source preferably comprises exactly one semiconductor laser.

According to at least one embodiment, the primary radiation, which is generated by the at least one semiconductor laser during operation, is ultraviolet radiation or visible light. For example, a wavelength of maximum intensity is at least 250 nm or 320 nm or 360 nm or 400 nm or 440 nm and/or at most 570 nm or 535 nm or 525 nm or 490 nm or 420 nm. In particular, the wavelength of maximum intensity of the primary radiation is 375 nm or 405 nm or 450 nm, in each case with a tolerance of at most 10 nm.

According to at least one embodiment, the semiconductor light source comprises one or more conversion elements. The at least one conversion element is designed to generate a longer-wave visible secondary radiation from the primary radiation. In other words, the conversion element converts the primary radiation completely or partially into the secondary radiation. In the intended use, the secondary radiation is emitted from the semiconductor light source and is perceived by a user.

According to at least one embodiment, the conversion element has a semiconductor layer sequence for generating the secondary radiation. The semiconductor layer sequence comprises one or more quantum well layers. The primary radiation is absorbed in the at least one quantum well layer and converted into the secondary radiation via charge carrier recombination. In other words, the quantum well layers are excited to photoluminescence by the primary radiation and thus optically pumped.

According to at least one embodiment, the quantum well layers are of a three-dimensional shape. This can mean that the quantum well layers or at least one of the quantum well layers or all quantum well layers, in particular when viewed in cross section, have one or more kinks. The quantum well layers or at least some of the quantum well layers are then, viewed in cross section, not configured as uninterrupted straight lines.

According to at least one embodiment, at least one, some or all of the quantum well layers, viewed in cross section, are arranged in places or completely obliquely to a growth direction of the semiconductor layer sequence of the conversion element. In other words, the quantum well layers are oriented neither parallel nor perpendicular to the growth direction, at least in certain regions or even entirely.

According to at least one embodiment, at least one, some or all of the quantum well layers, viewed in cross section, are arranged in places or completely perpendicular to the growth direction of the semiconductor layer sequence of the conversion element. The respective quantum well layers can be restricted to the base regions and can be designed as continuous layers, or can be located only within the semiconductor columns, or else both.

In at least one embodiment, the semiconductor light source comprises at least one semiconductor laser for generating a primary radiation and at least one conversion element for generating a longer wavelength, visible secondary radiation from the primary radiation. In order to generate the secondary radiation, the conversion element has a semiconductor layer sequence having one or more quantum well layers. The quantum well layers are preferably shaped three-dimensionally, so that the quantum well layers have kinks when viewed in cross section and/or are oriented at least in places obliquely to a growth direction of the semiconductor layer sequence.

In the semiconductor light source described here, an efficient, radiation-generating semiconductor laser can be used as a light source for the primary radiation. By means of the conversion element, in the case of a specific semiconductor laser for generating the primary radiation, an emission wavelength range can be set by using quantum well layers that can be configured differently. By using photoluminescent quantum well layers in the conversion element, a high conversion efficiency can be achieved and the desired spectral properties of the secondary radiation can be specifically set by a design of the quantum well layers. A highly efficient, colored semiconductor light source, which can also be scaled in size, can thus be achieved, in particular with a directional emission characteristic.

In contrast, other scalable light sources having a directional emission characteristic such as vertically emitting semiconductor lasers, that is to say with semiconductor lasers which emit in the direction parallel to a growth direction, have only a low efficiency. Light sources having nanostructures and having a phosphor conversion layer likewise have a comparatively low conversion efficiency and cause difficulties in electrical contacting and when coupling out light. White light-emitting laser diodes which are provided with a phosphor require, as a rule, a complex optical system in order to focus and efficiently couple light out of the phosphor. Thus, such alternative solutions have a low component efficiency and a relatively low conversion efficiency, as well as a more complex design, for instance with regard to electrical contacting or optics.

According to at least one embodiment, a main emission direction of the semiconductor light source is oriented parallel to the growth direction of the semiconductor layer sequence of the conversion element, with a tolerance of at most 15° or 10° or 5°. An emission angle range of the conversion element has a half-width of at most 90° or 70°, so that light is emitted more directional by the conversion element than in the case of a Lambertian emitter. In the case of a Lambertian emitter, the following applies to an intensity I as a function of an angle $\alpha$ and relative to a maximum intensity $I_{max}$: $I(\alpha) = I_{max} \cos \alpha$. In the case of a Lambertian emitter, the half-width of the emission characteristic is thus substantially greater.

According to at least one embodiment, the semiconductor laser and the conversion element are grown epitaxially independently of one another. That is to say that the semiconductor laser and the conversion element are two components produced independently of one another, which are only combined in the semiconductor light source.

According to at least one embodiment, the conversion element and the semiconductor laser do not touch each other. This can mean that an intermediate region with a different material is present between the semiconductor laser and the conversion element. The intermediate region is, for example, gas-filled or evacuated or bridged by a light guide or a transparent body such as a transparent semiconductor material.

According to at least one embodiment, in operation the primary radiation is irradiated into the semiconductor layer sequence perpendicular to the growth direction, with a tolerance of at most 15° or 10° or 5° or 1°. In other words, the irradiation direction of the primary radiation can be oriented perpendicular to the main emission direction of the conversion element. If, for example, the semiconductor laser has a Gaussian beam profile when viewed in a cross section, the emission direction of the semiconductor laser thus relates to the direction of maximum intensity. This can apply correspondingly to other emission profiles of the primary radiation.

According to at least one embodiment, the primary radiation is emitted in a linear shape by the semiconductor laser or in an elliptical emission characteristic or elliptical angular distribution or also linearly. This can mean that an aspect ratio of a width and a length of the primary radiation, in particular seen in the optical far field, is at least 2 or 5 or 10 or 50. A uniform illumination of the semiconductor layer sequence of the conversion element can be achieved by such a line profile of the primary radiation.

According to at least one embodiment, the semiconductor laser is arranged such that a growth direction of the semiconductor laser is oriented perpendicular to the growth direction of the semiconductor layer sequence. In this case, the growth direction of the semiconductor laser is preferably parallel to a plane which is defined by the semiconductor layer sequence. In other words, the growth direction of the semiconductor laser is oriented perpendicular to the growth direction of the semiconductor layer sequence and thus parallel to a plane to which the growth direction of the semiconductor layer sequence is perpendicular. This applies in particular to a tolerance of at most 10° or 5° or 1°. Furthermore, the growth direction of the semiconductor laser is preferably oriented perpendicular to the emission direction of the semiconductor laser, which in turn can be oriented perpendicular to the growth direction of the semiconductor layer sequence of the conversion element.

According to at least one embodiment, the semiconductor laser is a so-called stripe laser, also referred to as a ridge laser. In this case, the semiconductor laser comprises at least one ridge which is produced from a semiconductor layer sequence of the semiconductor laser and which serves as a waveguide for the primary radiation within the semiconductor laser.

According to at least one embodiment, during operation, the primary radiation is irradiated into the semiconductor layer sequence of the conversion element parallel to the growth direction of the semiconductor layer sequence, with a tolerance of at most 10° or 5° or 1°. In this case, an emission direction of the semiconductor laser can be oriented parallel to the main emission direction of the conversion element. If both primary radiation and secondary radiation are emitted from the semiconductor light source, it is possible that a direction of the primary radiation is not or not significantly changed after leaving the semiconductor laser.

According to at least one embodiment, the conversion element has a base region. The base region is preferably a continuous, uninterrupted region of the semiconductor layer sequence of the conversion element. In particular, the base region extends perpendicular to a growth direction of the semiconductor layer sequence. It is possible for the base region to be free of quantum well layers. Alternatively, the quantum well layers can be located in the base region.

According to at least one embodiment, the conversion element comprises a plurality of semiconductor columns. The semiconductor columns preferably extend away from the base region, in the direction parallel to the growth direction of the semiconductor layer sequence.

According to at least one embodiment, the semiconductor layer sequence, in particular the base region, works as a waveguide for the primary radiation within the conversion element. In particular, the semiconductor layer sequence and/or the base region is/are designed as a waveguide in the direction perpendicular to the growth direction of the semiconductor layer sequence.

According to at least one embodiment, the semiconductor columns, as waveguides for the primary radiation, are aligned along the direction parallel to the growth direction and in particular also along the direction parallel to the main emission direction of the conversion element. Thus, by means of the semiconductor columns, an emission characteristic and especially the main emission direction of the conversion element can be determined. The semiconductor columns are preferably not a photonic crystal. The semiconductor columns differ from a photonic crystal in particular by means of larger geometric dimensions and by an irregular or less regular arrangement.

According to at least one embodiment, the primary radiation passes from the semiconductor laser in a free-beam manner to the semiconductor layer sequence. This can mean that there are no optics for the primary radiation between the semiconductor layer sequence and the semiconductor laser and/or a region between the semiconductor laser and the semiconductor layer sequence is completely or predominantly evacuated or filled with a gas. Predominantly can mean that an optical path between the semiconductor laser and the semiconductor layer sequence is at least 50% or 70% or 90% free of condensed matter.

According to at least one embodiment, the at least one quantum well layer is applied to and/or on the semiconductor columns. In this case, the quantum well layers can imitate a shape of the semiconductor columns. In particular, the semiconductor columns form a core and the quantum well layers form a mantle. Such a structure is also referred to as a core-shell structure.

Any kinks in the quantum well layers, which may be present in cross section, can result, for example, from the quantum well layers from side surfaces of the semiconductor columns bending in the direction towards an upper side of the semiconductor columns and optionally also bending back towards an opposite side surface. The quantum wells can follow a crystal structure of the underlying layers and/or of the rods.

According to at least one embodiment, the secondary radiation and/or the primary radiation is/are radiated out of the semiconductor columns to at least 50% or 70% or 85% at the tips of the semiconductor columns. In other words, regions between the semiconductor columns and side faces of the semiconductor columns are dark or significantly darker, especially in comparison to the tips of the semiconductor columns.

According to at least one embodiment, the semiconductor columns have an average diameter of at least 0.5 µm or 0.7 µm or 1 µm. Alternatively or additionally, the average diameter is at most 10 µm or 4 µm or 3 µm.

According to at least one embodiment, a ratio of a mean height and the mean diameter of the semiconductor columns is at least 2 or 3 or 5 and/or at most 20 or 10 or 7 or 5. By such a ratio of height and diameter, the semiconductor columns can serve as waveguides for the primary radiation in the direction parallel to the main emission direction.

According to at least one embodiment, the quantum well layers are shaped like pyramid shells or assembled from a plurality of pyramid shells. In other words, the quantum well layers can be designed similarly to an egg carton or napped foam. In this case, the quantum well layers are preferably shaped like hexagonal pyramids, in particular as viewed as a relief.

According to at least one embodiment, the quantum well layers are surrounded by further layers of the semiconductor layer sequence on two opposing main sides. In other words, the quantum well layers can be embedded in the semiconductor layer sequence so that the quantum well layers do not represent any outer layers of the semiconductor layer sequence. The further layers are, for example, cladding layers having a relatively low refractive index to enable a wave guidance of the primary radiation in the direction perpendicular to the growth direction of the semiconductor layer sequence.

According to at least one embodiment, the quantum well layers are designed to generate different wavelengths of the secondary radiation. In this case, the different wavelengths can be generated in different regions along the growth direction or in different regions parallel to the growth direction. For example, quantum well layers are provided for generating blue light and/or green light and/or yellow light and/or red light.

According to at least one embodiment, a spectral half-width of the secondary radiation, which is generated by the quantum well layers, is at least 40 nm or 60 nm or 80 nm. Thus, the secondary radiation is in particular mixed-colored light, for example, white light. According to at least one embodiment, the conversion element comprises one or more further luminous materials in addition to the quantum well layers, preferably inorganic phosphors. The luminous material specified in the publication EP 2 549 330 A1 or else quantum dots can be used as phosphors. The at least one luminous material can be one or more of the following substances: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}:RE$ where X=halide, N or divalent element, D=three- or four-valent element and RE=rare earth metals, such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped SiONs such as $(Ba,Sr,Ca)Si_2O_2N_2:Eu^{2+}$; SiAlONs e. g. from the system $Li_xM_yLn_zSi_{12-(m+n)}Al_{(m+n)}O_nN_{16-n}$; orthosilicates such as $(Ba,Sr,Ca,Mg)_2SiO_4:Eu^{2+}$.

According to at least one embodiment, an emission surface of the semiconductor laser for the primary radiation is smaller by at least a factor of 10 or 100 or 1000 than an emission surface of the conversion element for the secondary radiation and/or the primary radiation. In other words, an enlargement of an emission surface, relative to the emission surface of the semiconductor laser, takes place in the conversion element.

According to at least one embodiment, the primary radiation does not leave the semiconductor light source during its intended use. In this case, the primary radiation is preferably completely or substantially completely converted into the secondary radiation. An additional filter layer can be located on a light exit side of the conversion element, the filter layer prevents the primary radiation from leaving the semiconductor light source.

According to at least one embodiment, the primary radiation is only partially converted into the secondary radiation. This means, in particular, that a mixed radiation is emitted by the semiconductor light source, which is composed of the primary radiation and of the secondary radiation. A power proportion of the primary radiation on the mixed radiation is preferably at least 10% or 15% or 20% and/or at most 50% or 40% or 30%.

According to at least one embodiment, the at least one semiconductor laser and the at least one conversion element are monolithically integrated. This can mean that the semiconductor laser and the conversion element are grown on the same growth substrate and are preferably still located on the growth substrate. This can likewise mean that the semiconductor laser and the conversion element are formed from a contiguous semiconductor layer sequence.

BRIEF DESCRIPTION OF THE DRAWINGS

A semiconductor light source described here is explained in more detail below with reference to the drawing on the basis of exemplary embodiments. Identical reference signs indicate the same elements in the individual figures. In this case, however, no relationships to scale are illustrated; rather, individual elements can be represented with an exaggerated size in order to afford a better understanding.

In the figures:

FIGS. 1 to 18 show schematic sectional representations of exemplary embodiments of semiconductor light sources;

DETAILED DESCRIPTION OF ILLUSTRATIVE EMBODIMENTS

Figure 6:
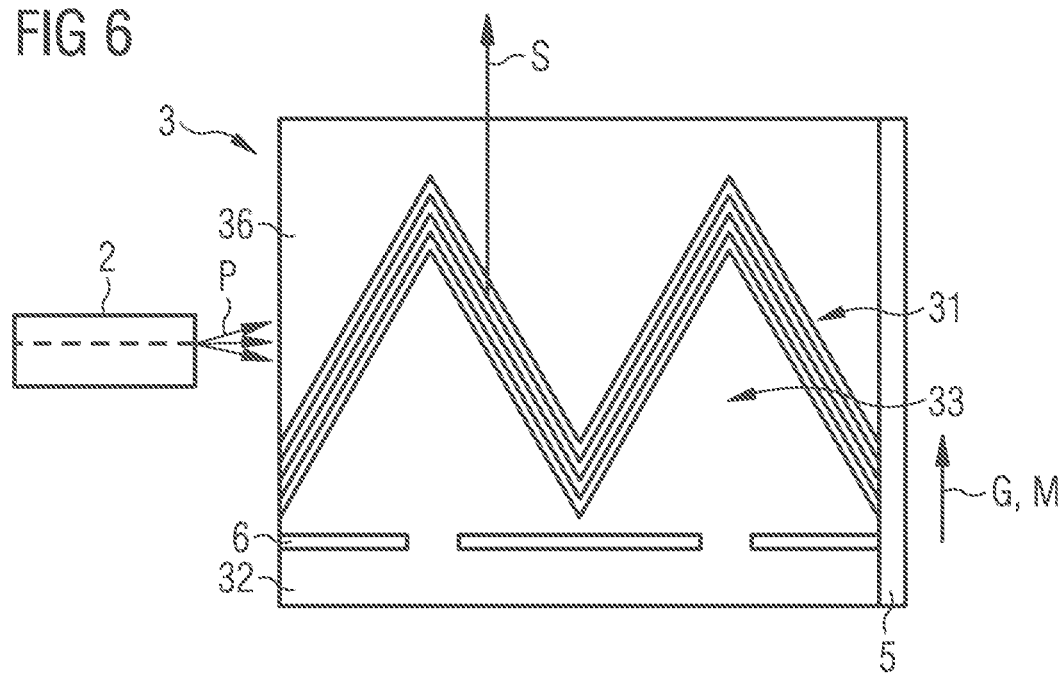

FIG. 1 shows an exemplary embodiment of a semiconductor light source 1. The semiconductor light source 1 comprises a semiconductor laser 2 having an active zone 22. The semiconductor laser 2 has a growth direction H. A primary radiation P exits from the semiconductor laser 2 at a light exit region 20 and is emitted towards a conversion element 3. The primary radiation P is generated by means of electroluminescence.

The conversion element 3 of the semiconductor light source 1 contains a semiconductor layer sequence 30 which is optionally located on a growth substrate 38. A growth direction G of the semiconductor layer sequence 30 can be oriented parallel to the growth direction H of the semiconductor laser 2.

The semiconductor layer sequence 30 comprises a base region 33 and a multiplicity of semiconductor columns 34 in the base region 33, the primary radiation P is guided in the direction perpendicular to the growth direction G of the semiconductor layer sequence 30. A uniform distribution of the primary radiation P across the conversion element 3 can be achieved by means of the base region 33. The semiconductor columns 34 extend from the base region 33. Quantum well layers 31 are grown on the semiconductor columns 34. The quantum well layers 31 represent envelopes to the semiconductor columns 34. Optionally, the quantum wells 31 are covered by a further semiconductor layer 36 or also by a protective layer, not shown.

The semiconductor layer sequence is preferably based on a nitride compound semiconductor material such as $Al_n In_{1-n-m} Ga_m N$ or on a phosphide compound semiconductor material $Al_n In_{1-n-m} Ga_m P$ or else on an arsenide compound semiconductor material such as $Al_n In_{1-n-m} Ga_m As$ or as $Al_n Ga_m In_{1-n-m} As_k P_{1-k}$, wherein in each case $0 \leq n \leq 1$, $0 \leq m \leq 1$ and $n+m \leq 1$ and $0 \leq k < 1$. Preferably, the following applies to at least one layer or for all layers of the semiconductor layer sequence $0 < n \leq 0.8$, $0.4 \leq m < 1$ and $n+m \leq 0.95$ and $0 < k \leq 0.5$. The semiconductor layer sequence can have dopants and additional components. For the sake of simplicity, however, only the essential components of the crystal lattice of the semiconductor layer sequence are mentioned, that is, Ga, In, N or P, even if these can be partially replaced and/or supplemented by small quantities of further substances. The semiconductor layer sequence is preferably based on $Al_n In_{1-n-m} Ga_m N$, as in all other exemplary embodiments.

The semiconductor columns 34 form a waveguide for the primary radiation P in the direction parallel to the growth direction G. The primary radiation P exits the semiconductor columns 34 at tips 35 of the semiconductor columns 34, passes through the quantum well layers 31 and is converted into a secondary radiation S. A mixture of the secondary radiation S and the primary radiation P is thus emitted at the tips 35. Alternatively, it is possible for only the secondary radiation S to emerge from the conversion element 3.

Both the semiconductor laser 2 and the conversion element 3 are located on a common carrier 4, which can also contain further electronic components (not shown), for example, for controlling the semiconductor laser 2.

According to FIG. 1, the tips 35 of the semiconductor columns 34 are of pyramid-shaped design, for example, as hexagonal pyramids. Seen in cross section, the quantum well layers 31 therefore have kinks. Unlike in FIG. 1, it is also possible for the quantum well layers 31 to be restricted only to the tips 35 so that a region between the semiconductor columns 34 and/or side surfaces of the semiconductor columns 34 is then free of the quantum well layers 31.

The conversion element 3 is a structure similar to an LED, wherein electrical contact layers and current spreading layers can be dispensed with, since the secondary radiation S is generated by photoluminescence. Through the quantum well layers, for example, by the thickness and/or material composition thereof, a wavelength of the secondary radiation S can be set in a targeted manner over a wide range. Since no electrical contact layers or current spreading layers need to be present, an efficiency of the photoluminescence can be increased compared to electroluminescence in a conventional light-emitting diode. Furthermore, a base area of the conversion element is substantially freely scalable. In addition, a light intensity of the semiconductor light source 1 can be set by using different and/or a plurality of semiconductor lasers 2.

In other words, the primary radiation P, which is laser radiation, is coupled into the conversion element 3 as a beam-shaping element, for instance into a lateral chip flank of an LED chip on the basis of the material system InGaN with a sapphire growth substrate 38. The conversion element 3 contains a waveguide with an optically active coupling-out structure, formed by the semiconductor columns 34. The primary radiation P couples into the base region 33 and is coupled out via the semiconductor columns 34. The optically active layer in the form of the quantum well layers is located on a surface of the semiconductor columns 34 serving as the coupling-out structure, which is pumped by the laser light of the primary radiation P. Thus, an efficient, scalable light source having an adjustable color can be produced without having to use expensive optics.

For example, the semiconductor laser 2 is a laser having a main emission wavelength at approximately 405 nm, as used for blu-rays. In this case, the primary radiation P is preferably completely converted into the secondary radiation S.

Because of the wave guidance of the primary radiation P in the semiconductor columns 34 and because of the design of the tips 35 it is achieved that the secondary radiation and/or the primary radiation P is/are predominantly emitted in the direction parallel or approximately parallel to the growth direction G so that a dedicated main emission direction M results. Radiation through the conversion element 3 is thus spatially narrower than in the case of a Lambertian emitter.

A further exemplary embodiment is illustrated in FIG. 2. In contrast to FIG. 1, the semiconductor columns 34 are rectangular in cross section so that the tips 35 are oriented perpendicular to the growth direction G. Furthermore, a mirror 5 is provided which extends between the optional growth substrate 38, which is in particular made of sapphire, and the carrier 4. Such a mirror 5 can also be present in all other exemplary embodiments and is, for example, a metallic mirror or a dielectric multilayer or single-layer mirror or a combination of at least one dielectric layer and at least one metal layer or semiconductor layer.

Furthermore, a luminous material 37 is additionally present in the conversion element 3. An additional secondary radiation S2 can be generated via the luminous material 37, in particular in a different color than the secondary radiation S directly from the quantum well layers 31.

The luminous material 37 is formed, for example, by inorganic phosphor particles which are embedded in a uniformly distributed manner in a matrix material, for example, a silicone or an epoxide. The secondary radiation S2 is preferably generated essentially in regions above the tips 35 of the semiconductor columns 34.

In the exemplary embodiment of FIG. 3, the quantum well layers 31 are attached to the semiconductor columns 34, which are shaped as a trapezoid in each case when viewed in cross section, wherein the semiconductor columns 34 taper in the direction away from the base region 33.

As also possible in all other exemplary embodiments, the luminous material 37 can imitate a shape of the semiconductor columns 34 so that a height of the luminous material 37, relative to the base region 33, directly above the semiconductor columns 34 can be larger than in regions between the semiconductor columns 34. In this case, a side of the luminous material 37 facing away from the base region 33 can imitate the semiconductor columns 34 not only exactly but also in approximation or in a smoothed manner.

Optionally, it is also possible for phosphor particles to be present in regions between the semiconductor columns 34 in a reduced concentration or that the phosphor particles are restricted to a region above the tips 35.

Optionally, as in all other exemplary embodiments, a further mirror 5b is present, in addition to the mirror 5a between the carrier 4 and the semiconductor layer sequence 30. The mirror 5b is oriented perpendicular to a beam direction of the primary radiation P. The primary radiation P can be distributed more uniformly in the base region 33 by means of the mirror 5b.

A further exemplary embodiment is illustrated in FIG. 4. As in all other exemplary embodiments, it is possible that more than one semiconductor laser 2 is used; according to FIG. 4, two of the semiconductor lasers 2 are present.

The luminous material 37 is designed as a plate or platelet having approximately plane-parallel main sides. Thus, an intermediate space between adjacent semiconductor columns 34 is free of the luminous material 37.

The quantum well layers 31 are located on tips of the semiconductor columns 34 which originate from the base region 33. Optionally, a further semiconductor material 36 is located above the quantum well layers 31, in the direction away from the base region 33, for example, to protect the quantum well layers 31. The platelet with the luminous material 37 is thus either applied to the further semiconductor material 36 or, in contrast to the illustration in FIG. 4, is applied directly to the quantum well layers 31. In this case, the luminous material 37 can be adhesively bonded, for example, via a transparent, for instance silicone-containing adhesive. Unlike in FIG. 4, a transparent, optically non-active adhesive or residues thereof can extend into a region between the semiconductor columns 34.

In FIGS. 1 to 4, different embodiments of the semiconductor columns 34, of the luminous material 37 and of the mirrors 5 are drawn. These different configurations of the individual components can in each case be transferred to the other exemplary embodiments. For example, the mirrors 5a, 5b from FIG. 3 can also be used in the exemplary embodiments of FIGS. 1, 2 and 4, or the semiconductor columns 34 from FIG. 1 can be present in FIGS. 2, 3 and 4.

In the exemplary embodiment of FIG. 5, the quantum well layers 31 are composed of pyramid-shaped parts, similarly to napped foam. This is achieved, for example, in that on a growth layer 32, which is based, for example, on GaN, a mask layer 6, for instance made of silicon dioxide, is applied. Proceeding from openings in the mask layer 6, pyramid-shaped base regions 33 are grown, on which the quantum well layers 31 are formed. Optionally, the further semiconductor layer 36, for instance made of GaN, is present, which can lead to a planarization. In other words, the base regions are three-dimensionally grown, the quantum well layers 31 are applied to the base regions 33 true to shape, and the further semiconductor layer 36 is a two-dimensionally grown layer.

As in all other exemplary embodiments, it is also possible for cladding layers 39 having a lower refractive index to be present, in order to ensure guidance of the primary radiation P in the direction perpendicular to the growth direction G. Optionally present mirrors are not shown in FIG. 5. Such a mirror is represented schematically in FIG. 6, for example.

Figure 7:
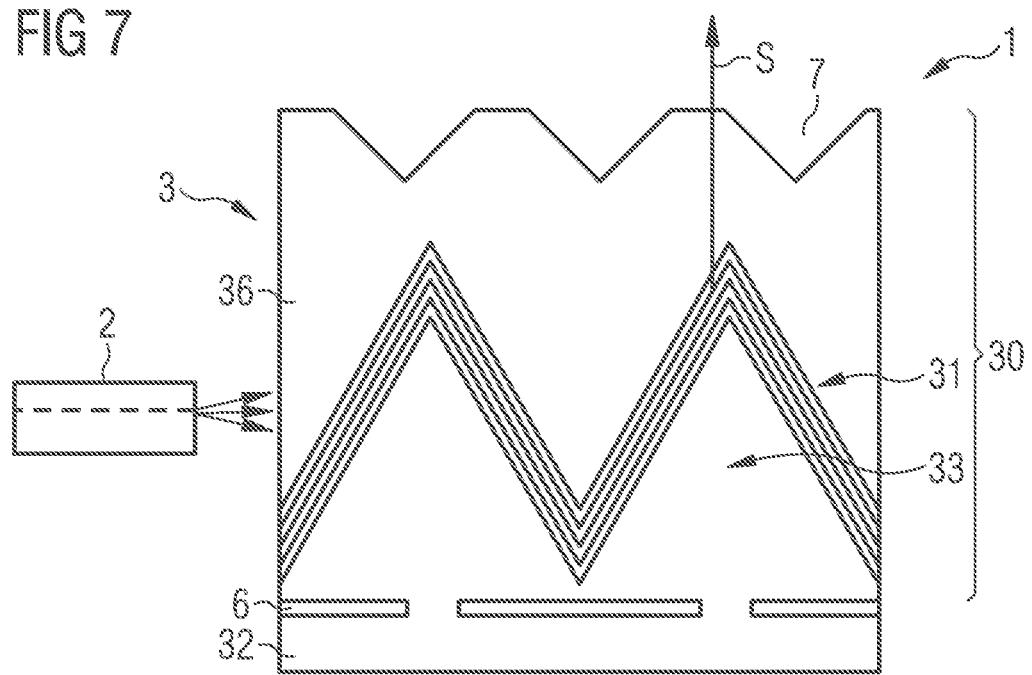

In the exemplary embodiment of FIG. 7, deviating from FIG. 5, a roughening 7 is present on a side of the semiconductor layer sequence 30 facing away from the growth layer 32. By means of such a roughening 7, an emission characteristic can be influenced and a more efficient light output can also be achieved.

Figure 8:
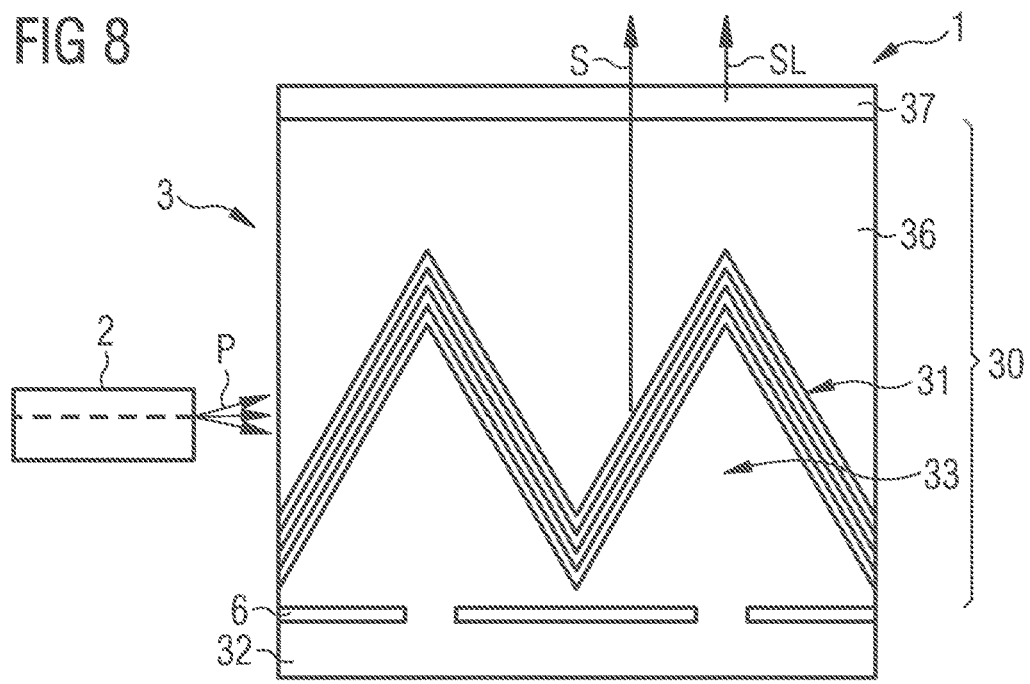

In the exemplary embodiment of FIG. 8, the luminous material 37 is additionally present as a layer on the semiconductor layer sequence 30.

Figure 9:
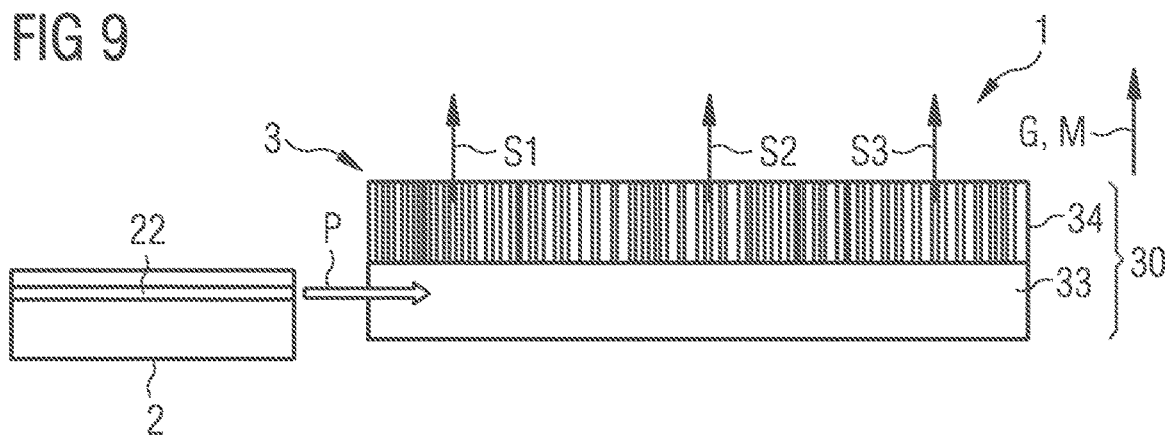

FIG. 9 schematically illustrates that the conversion element 3 comprises different semiconductor columns 34 with differently designed quantum wells. As a result, in different regions of the conversion element 3, viewed in a plan view, secondary radiation S1, S2, S3 having different wavelengths is emitted. It is thus possible for mixed-colored white light to be generated by the semiconductor light source 1, in particular composed only from the secondary radiations S1, S2, S3.

Figure 10:
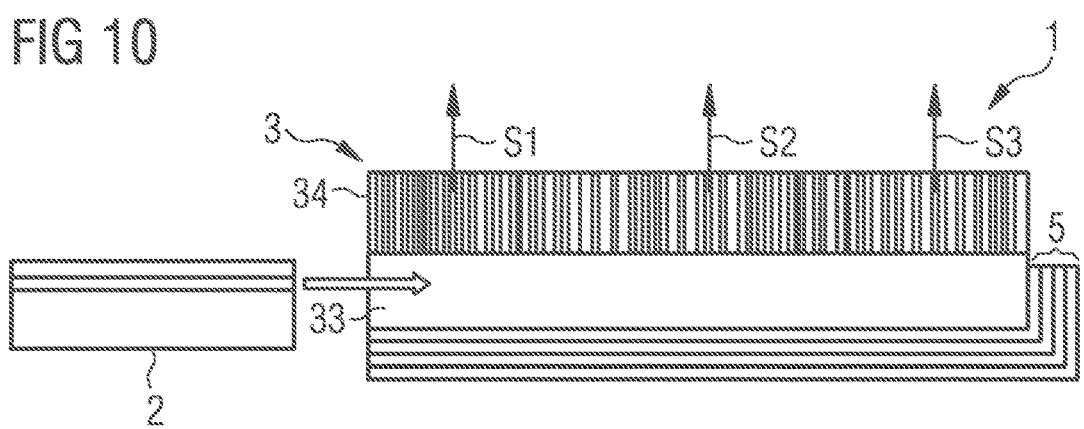

According to FIG. 10, a mirror 5 is additionally present, which can be designed as a Bragg mirror with a plurality of layers with alternately high and low refractive indices. Such a mirror is composed, in particular, of dielectric layers, and can have a profile with regard to a reflection wavelength and can thus be designed as a so-called chirped mirror. According to FIG. 10, the mirror 5 covers an underside of the base region 33 facing away from the semiconductor columns 34 and an end face of the base region 33 opposite the semiconductor laser 2.

A mirror 5 is also present in FIG. 11. The mirror 5 can be, as in all other exemplary embodiments, a metallic reflector, for example, with silver and/or aluminum. Possible protective layers for the mirror 5 are not shown in FIG. 11. The mirror 5 completely covers a bottom surface and side surfaces of the conversion element 3, with the exception of a light entrance opening for the primary radiation P. It is optionally possible that a side of the semiconductor columns 34 which faces away from the base region 33 is covered by the mirror 5 in a small part all around an edge.

A further exemplary embodiment is illustrated in FIG. 12. In this case, the semiconductor laser 2 is mounted on a heat sink 81 and is contacted via electrical connections 83 out of a housing body 82. The semiconductor light source 1 can be configured as a so-called TO design.

The semiconductor layer sequence 30 with the semiconductor columns 34 is arranged on a carrier 38, in particular a growth substrate for the semiconductor layer sequence 30. The primary radiation P is irradiated into the semiconductor layer sequence 30 in the direction parallel to the growth direction G and is partially converted into the secondary radiation S. Thus, a mixture of the secondary radiation S and the primary radiation P is emitted through a light exit window 84. In contrast to the illustration, the light exit window 894, as in all other exemplary embodiments, can be designed as an optical element such as a lens.

According to FIG. 13, a plurality of semiconductor layers 30 having different quantum well layers 31a, 31b are present. Each of the quantum well layers 31a, 31b generates a secondary radiation S1, S2 of a particular color. Thus, mixed-colored light, which can be free of the primary radiation P, is generated by the quantum well layers 31a, 31b.

Figure 14:
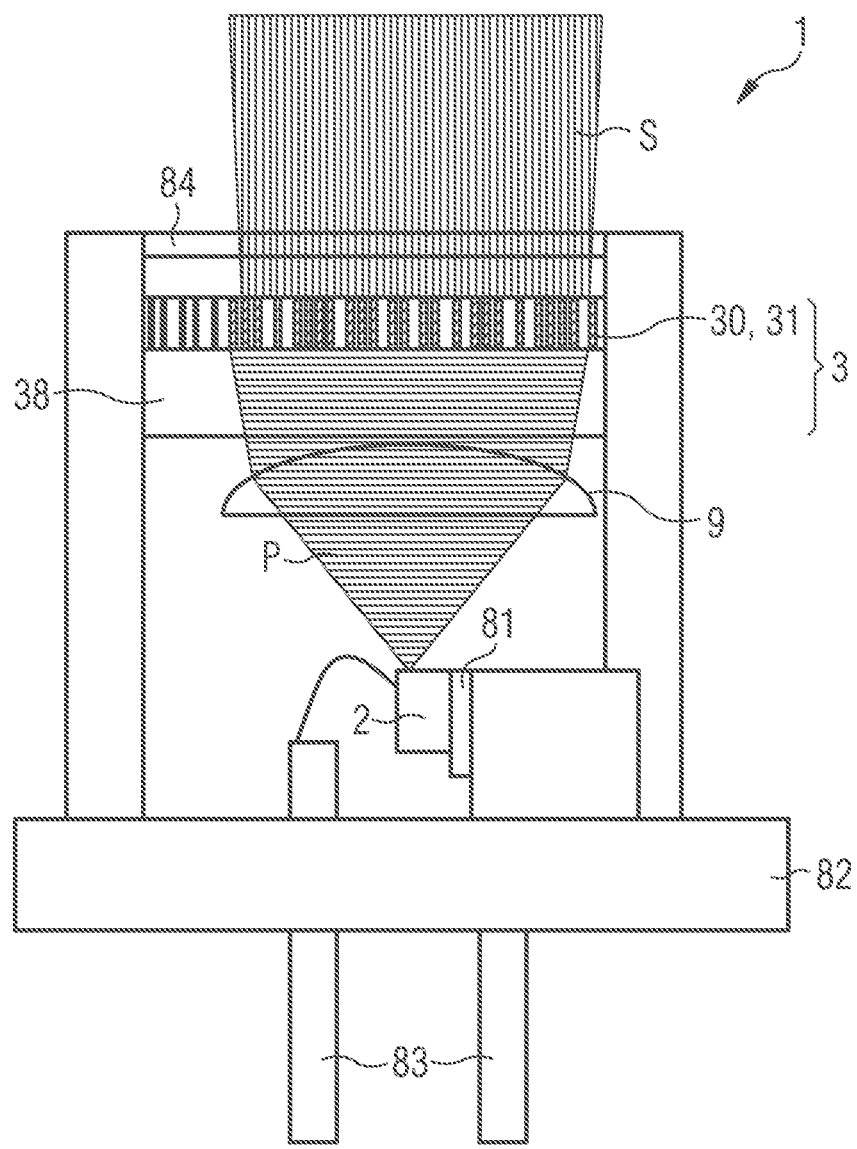

According to FIG. 14, an optical system 9 is located between the semiconductor laser 2 and the conversion element 3, the optical system 9 is preferably also present in all other exemplary embodiments of FIGS. 12 and 13. A uniform or substantially uniform illumination of the quantum well layers 31 with the primary radiation P is achieved via the optical system 9. For example, the optical system 9 is a cylindrical lens.

Figure 15:
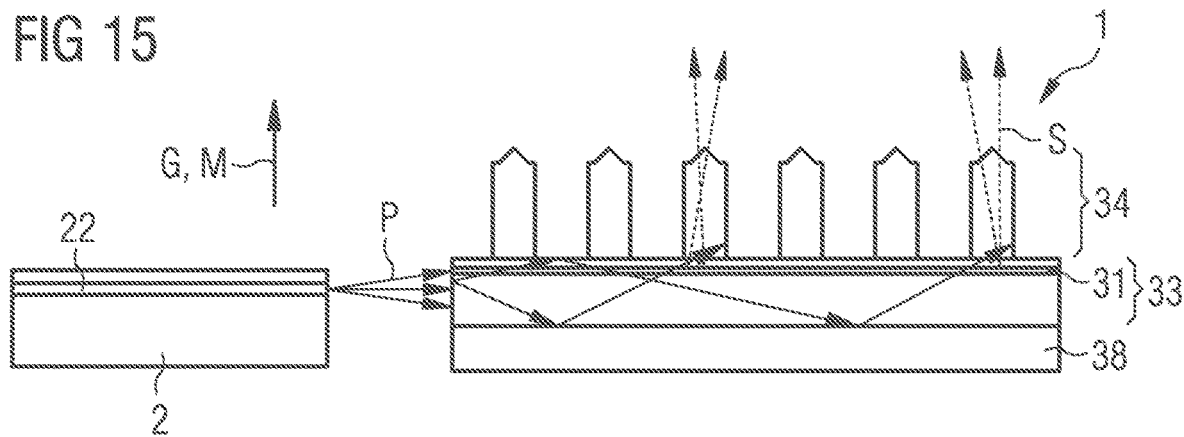

In the exemplary embodiment of FIG. 15, the quantum well layers 31 are located in the base region 33 and are oriented perpendicular to the growth direction G. In contrast to FIG. 15, according to FIG. 16 the quantum well layers 31 are located in the semiconductor columns 34. In this case, in particular the planar quantum well layers 31 and a region for the subsequent semiconductor columns 34 are first grown, only then are the semiconductor columns 34 prepared for instance by etching. The quantum well layers 31 can thus lie in the interior of the semiconductor columns 34 or also below the base region 33 as a flat quantum film.

Figure 16:
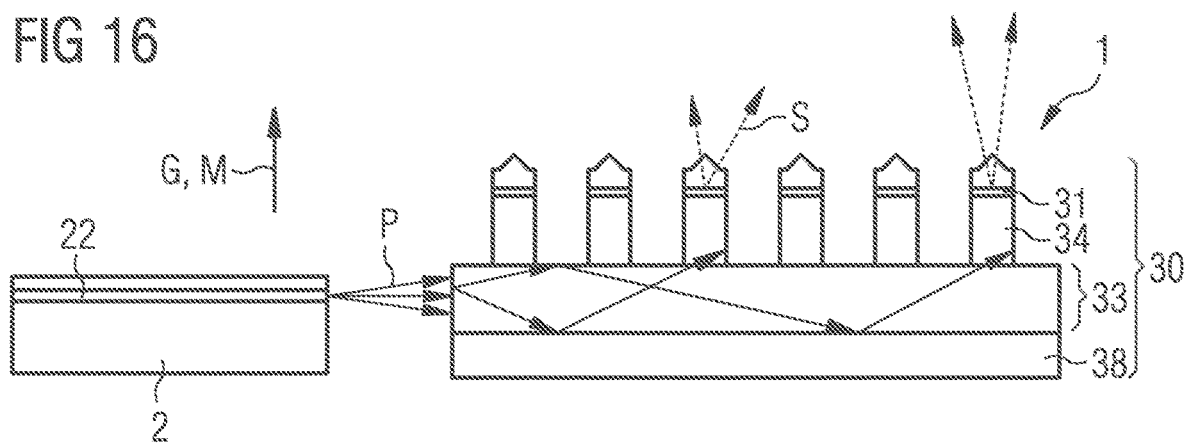

Further, these statements with regard to the semiconductor laser 2, the cladding layer 39, the growth substrate 38 and the luminous material 37 to FIGS. 1 to 4 apply correspondingly to FIGS. 15 and 16.

Figure 17:
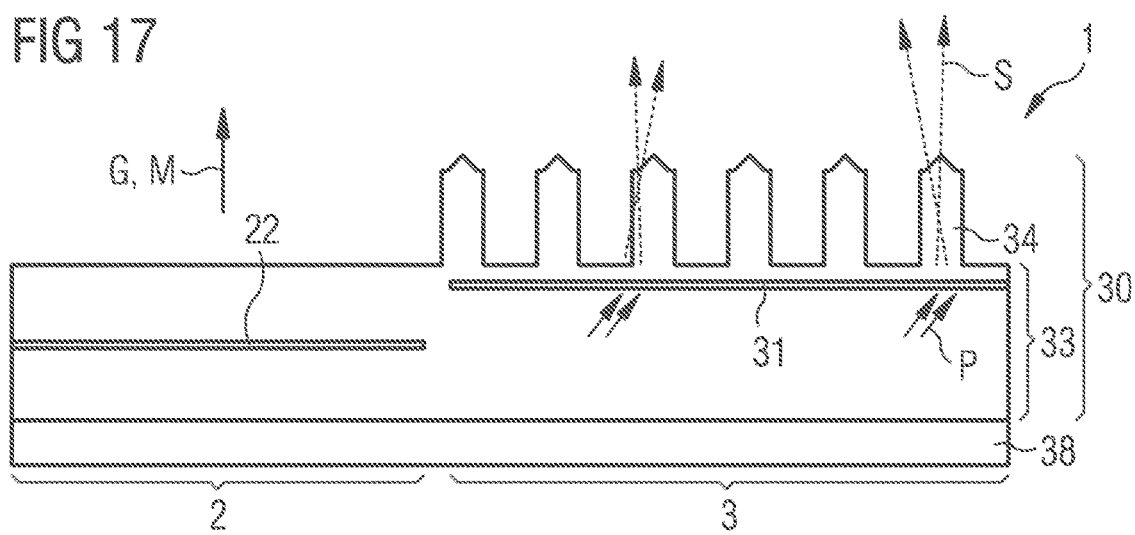
Figure 18:
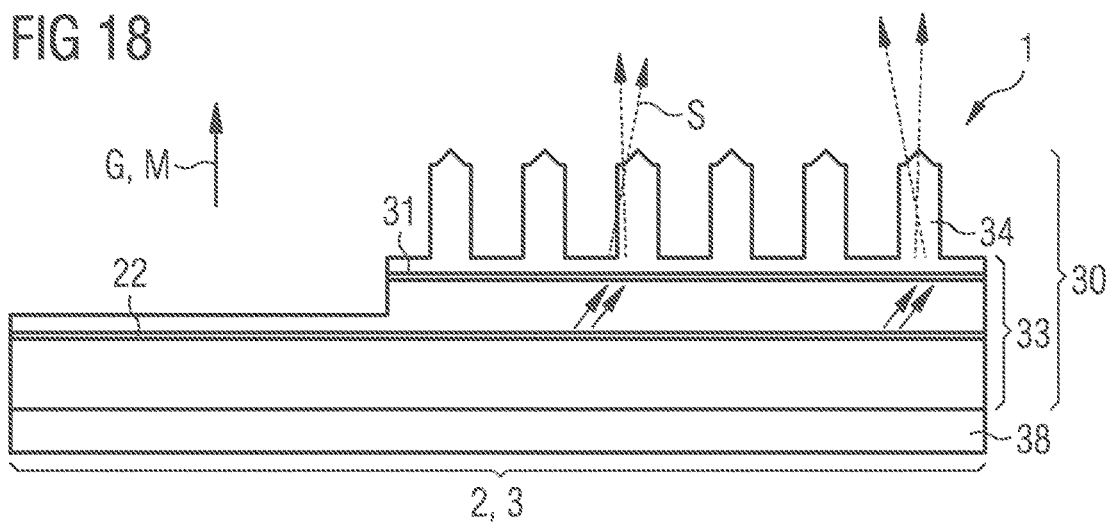

In the semiconductor light source 1 of FIGS. 17 and 18, the semiconductor laser 2 and the conversion element 3 are monolithically integrated on a common growth substrate 38. In this case, the quantum well layers 31 are located in or near a waveguide of the semiconductor laser 2 for the primary radiation P so that as much primary radiation P as possible can be scattered out of the waveguide and an efficient coupling to the quantum well layers 31 takes place. The active zone 22 of the semiconductor laser 2 and the quantum well layers 31 are preferably spatially separated from one another in this case.

In this case, the active zone 22 of the semiconductor laser 2 in FIG. 17 is applied to a region next to the semiconductor columns 34, viewed in a plan view. Thus, for example, the semiconductor columns 34 arranged above the semiconductor laser 2, along the growth direction G, are removed, but preferably not the base region 33. In contrast to the illustration, a gap can be located between the semiconductor laser 2 and the conversion element 3, in order to optimize resonator mirrors of the semiconductor laser 2, for example.

FIG. 18 shows that the active zone 22 of the semiconductor laser 2 also extends continuously over the conversion element 3 so that the quantum well layers 31 and the active zone 22 are stacked one on top of the other. For better electrical contacting, the base region 33 can be removed in the area next to the semiconductor columns 34, in contrast to FIG. 17. It is possible that a generation of the primary radiation P is also restricted to the area next to the semiconductor columns 34, viewed in a plan view, analogously to FIG. 17.

Figure 19:
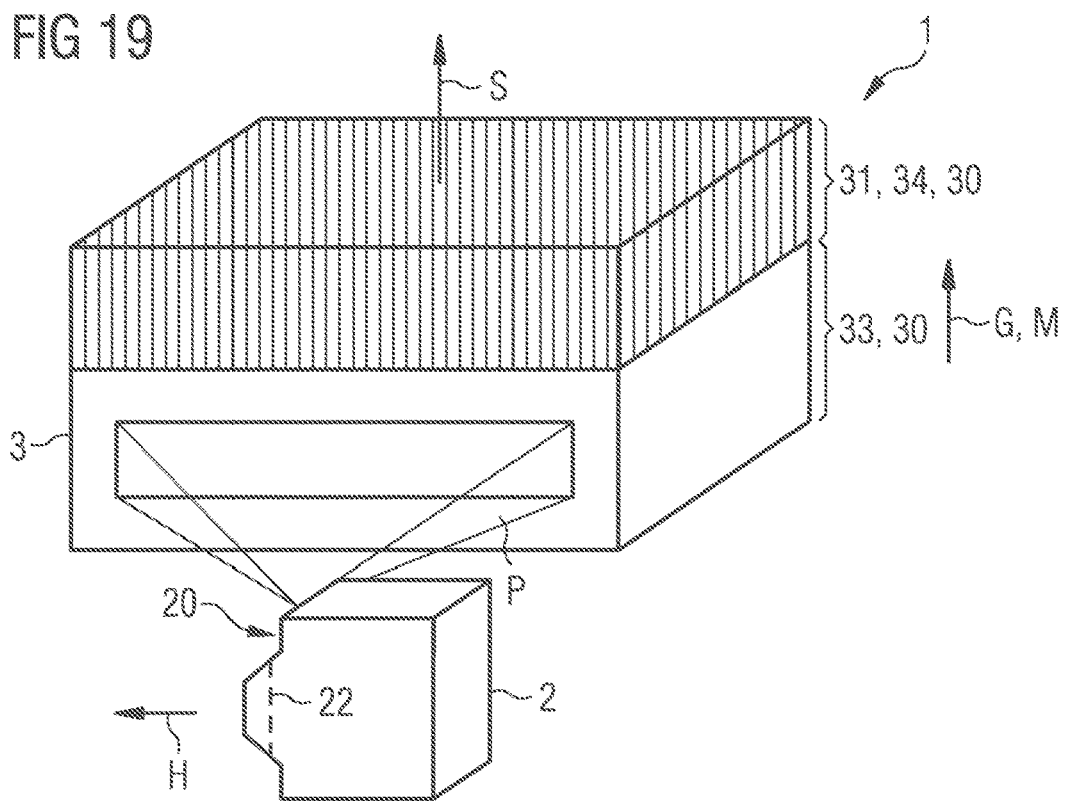
FIG. 19 shows a schematic perspective illustration of an exemplary embodiment of a semiconductor light source.

FIG. 19 shows that the semiconductor laser 2 is a so-called stripe laser, also referred to as a ridge laser. The primary radiation P is emitted linearly. In this case, the line on the conversion element 3 runs perpendicular to the growth direction G of the semiconductor layer sequence 30. A corresponding arrangement is preferably also selected in conjunction with the exemplary embodiments of FIG. 1 to 11, 15 or 16.

FIG. 20 shows further shapes of the tips 35. Such tips 35 can also be used in all other exemplary embodiments, wherein a plurality of different tip types can be combined with one another within a single conversion element 3.

Figures 20A, 20B, 20C, 20D, 20E, 20F:
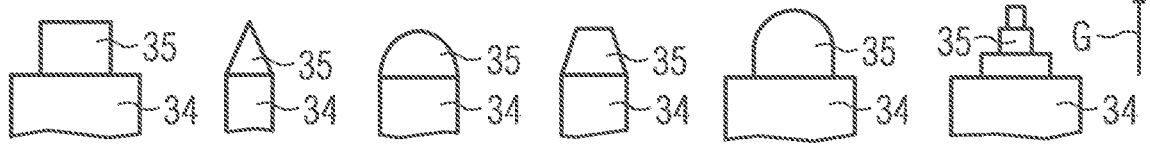
FIGS. 20A to 20F show schematic sectional representations of tips of semiconductor columns for exemplary embodiments of semiconductor light sources.

According to FIG. 20A, the tip 35 is of rectangular design, seen in cross section. The tip 35 has a smaller width than the remaining part of the semiconductor column 34.

Deviating from the representations in FIG. 20, the semiconductor columns 34 can also each have no special tips and appear rectangular when viewed in cross section, as is illustrated, for example, in FIG. 2, and as is also possible in all other exemplary embodiments. The semiconductor columns 34 can thus be formed cylindrically without a pointed structure.

In FIG. 20B it is shown that the tip 35 is triangular when viewed in cross section, wherein a flank angle, in comparison with FIG. 1, is relatively large so that an opening angle of the triangle, furthest away from the base region 33, is, for example, at most 60° or 45° or 30°. According to FIG. 20C, a semicircular shape is present and, according to FIG. 20D, a trapezoidal shape of the tip 35 is present.

According to FIG. 20E, the tip 35 is parabolic and has a smaller diameter than remaining regions of the semiconductor column 34, as can also apply correspondingly in FIG. 20B, 20C or 20D. Finally, see FIG. 20F, the tip 35 is designed as a stepped pyramid.

An average diameter of the semiconductor columns is preferably at least $\lambda/4n$, wherein $\lambda$ is the wavelength of maximum intensity of the primary radiation P and n is the refractive index of the semiconductor columns 34. The diameter is preferably between $5\lambda/n$ and $10\lambda/n$. A typical diameter can also lie at approximately $2\lambda/n$. An aspect ratio of a diameter and a height of the semiconductor columns is preferably at most 1 or 0.5 or 0.2.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

What is claimed is:

1. A semiconductor light source comprising:
    at least one semiconductor laser configured to generate a primary radiation; and
    at least one conversion element configured to generate a longer-wave visible secondary radiation from the primary radiation,
    wherein the conversion element comprises a semiconductor layer sequence having one or more quantum well layers,
    wherein, in operation, the primary radiation is irradiated into the semiconductor layer sequence parallel to a growth direction thereof, with a tolerance of at most 15°,
    wherein, in operation, the semiconductor layer sequence is homogeneously illuminated with the primary radiation, and
    wherein a growth substrate of the semiconductor layer sequence is located between the semiconductor layer sequence and the semiconductor laser, the growth substrate being oriented perpendicular to the growth direction.

2. The semiconductor light source according to claim 1, wherein the one or more quantum well layers are three-dimensionally shaped so that the one or more quantum well layers have kinks when viewed in cross section and are oriented at least in places obliquely to the growth direction of the semiconductor layer sequence.

3. The semiconductor light source according to claim 1, wherein the conversion element has a continuous base region and semiconductor columns extending away from the base region.

4. The semiconductor light source according to claim 3, wherein the one or more quantum well layers are arranged on the semiconductor columns,
    wherein, in operation, an emission of at least one of the secondary radiation and of the primary radiation from the semiconductor columns occurs to at least 50 percent on tips of the semiconductor columns.

5. The semiconductor light source according to claim 3, wherein the semiconductor columns have an average diameter of between 0.5 μm and 20 μm inclusive, and a ratio of a mean height of the semiconductor columns and the average diameter is between 3 and 26 inclusive.

6. The semiconductor light source according to claim 3, wherein the one or more quantum well layers are located in the base region and are oriented perpendicular to the growth direction, and wherein the one or more quantum well layers lie in an interior of the semiconductor columns.

7. The semiconductor light source according to claim 1, wherein the one or more quantum well layers are pyramid shaped or are composed of pyramid shapes, and wherein the one or more quantum well layers are surrounded by further layers of the semiconductor layer sequence on two main sides lying opposite one another.

8. The semiconductor light source according to claim 1, wherein the one or more quantum well layers are configured to generate different wavelengths of the secondary radiation, and wherein a spectral half-width of the secondary radiation, which is generated by the quantum well layers, is at least 60 nm.

9. The semiconductor light source according to claim 1, wherein the conversion element additionally comprises at least one luminous material.

10. The semiconductor light source according to claim 9, wherein the luminous material is doped with at least one rare earth.

11. The semiconductor light source according to claim 9, wherein the luminous material is selected from the group consisting of oxide, nitride, oxynitride, garnet, sulfide, silicate, phosphate and halide.

12. The semiconductor light source according to claim 1, wherein an emission surface of the semiconductor laser for the primary radiation is smaller by at least a factor of 100 than an emission surface of the conversion element for the secondary radiation.

13. The semiconductor light source according to claim 1, wherein the primary radiation does not leave the semiconductor light source during operation, and wherein a wavelength of maximum intensity of the primary radiation is between 360 nm and 490 nm inclusive.

14. The semiconductor light source according to claim 1, wherein, in operation, the primary radiation is only partially converted into the secondary radiation so that a mixed radiation is emitted by the semiconductor light source, which is composed of the primary radiation and of the secondary radiation, a power proportion of the primary radiation on the mixed radiation is at least 20 percent and at most 50 percent.

15. The semiconductor light source according to claim 1, wherein an optical system is located between the semiconductor laser and the conversion element.

16. The semiconductor light source according to claim 15, wherein the optical system is a cylindrical lens.

17. The semiconductor light source according to claim 1,
wherein the semiconductor laser is mounted distant from the growth substrate on a heat sink at a bottom of a cavity in a TO housing body and configured to be contacted via electrical connections out of the TO housing body,
wherein the growth substrate with the semiconductor layer sequence is fixed to side walls of the TO housing body and is followed by a light exit window which is an optical element.

* * * * *

UNITED STATES PATENT AND TRADEMARK OFFICE
CERTIFICATE OF CORRECTION

PATENT NO. : 11,165,223 B2
APPLICATION NO. : 16/890776
DATED : November 2, 2021
INVENTOR(S) : Bernhard Stojetz It is certified that error appears in the above-identified patent and that said Letters Patent is hereby corrected as shown below:

On the Title Page

Item [62], delete "now Pat. No. 10,075,853" insert --now Pat. No. 10,727,645--

Item [30], delete "10201610461617" insert --102016104616.7--

Signed and Sealed this
Fourteenth Day of December, 2021

Drew Hirshfeld
*Performing the Functions and Duties of the*
*Under Secretary of Commerce for Intellectual Property and*
*Director of the United States Patent and Trademark Office*